United States Patent
Douriet et al.

(10) Patent No.: US 6,426,686 B1
(45) Date of Patent: *Jul. 30, 2002

(54) MICROWAVE CIRCUIT PACKAGES HAVING A REDUCED NUMBER OF VIAS IN THE SUBSTRATE

(75) Inventors: Daniel F. Douriet, Rochester, MN (US); Jorge M. Hernandez, Chandler, AZ (US); M. P. Ramachandra Panicker, Camarillo, CA (US)

(73) Assignee: Microsubstrates Corporation, Tempe, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,195

(22) Filed: Jun. 16, 1999

(51) Int. Cl.$^7$ ................................................. H01P 5/00
(52) U.S. Cl. .................. 333/247; 257/664; 257/737; 257/738; 333/34
(58) Field of Search .................... 333/247, 260, 333/34; 257/664, 737, 738

(56) References Cited

U.S. PATENT DOCUMENTS

| | | | | |
|---|---|---|---|---|
| 5,087,896 A | * | 2/1992 | Wen et al. | 333/247 X |
| 5,307,237 A | * | 4/1994 | Waltz | 333/247 X |
| 5,424,693 A | * | 6/1995 | Lin | 333/247 X |
| 5,545,924 A | * | 8/1996 | Contolatis et al. | 333/247 X |
| 5,877,560 A | * | 3/1999 | Wen et al. | 257/778 |
| 5,952,719 A | * | 9/1999 | Robinson et al. | 257/778 X |
| 6,163,458 A | * | 12/2000 | Li | 257/778 X |

FOREIGN PATENT DOCUMENTS

| | | | | |
|---|---|---|---|---|
| JP | 5-75313 | * | 3/1993 | 333/247 |

* cited by examiner

Primary Examiner—Justin P. Bettendorf
(74) Attorney, Agent, or Firm—Cantor Colburn LLP

(57) ABSTRACT

A circuit package for a microwave signal comprises a substrate defining a MMIC surface of the substrate and an opposing non-MMIC surface of the substrate. The substrate is devoid of signal carrying vias. A waveguide is disposed on the MMIC surface of the substrate. A MMIC is disposed on the MMIC surface of the substrate, and the MMIC is in electrical communication with the waveguide. An I/O port is in electrical communication with the waveguide wherein a transmission path for the signal is provided from the I/O port, through the waveguide and to the MMIC. In an alternative exemplary embodiment of the invention, the I/O port of the circuit package is electrically connectable to a PC board. The MMIC surface of the substrate faces the PC board when the I/O port is electrically connected to the PC board.

18 Claims, 10 Drawing Sheets

COPLANAR WAVEGUIDE STRUCTURE

MICROWAVE CIRCUIT PACKAGES HAVING A REDUCED NUMBER OF VIAS IN THE SUBSTRATE

BACKGROUND OF THE INVENTION

1. Field of the Invention

This invention is related to the field of packages for Microwave Circuits, especially in the frequency band from 20 GHz and higher.

2. Prior Art

Microwave Monolithic Integrated Circuits (MMIC) and other microwave integrated circuit (IC) devices for microwave signals have been packaged using complex, high reliability, high cost packages, the designs of which are not conducive to high volume assembly. These MMIC packages (packages) have been used in such specialty microwave applications as Radio Frequency (RF) telescopes and other speciality applications.

However, in the growing markets of more mainstream commercial applications, e.g., Personal Communication Services, there is the need for low cost, wideband, surface mounted, reliable, user friendly MMIC packages. One such example of a growing commercial microwave application is the development of Line Microwave Distribution Systems (LMDS), two point radios and obstacle detection radar for automotive vehicles. Moreover other applications have been identified at 23, 28, 32, 38, 60 and 70 Ghz and higher, and the industry is approaching production of these products.

The MMIC packages are intended primarily for MMICs constructed substantially of semiconductor materials suitable for high frequency operation, e.g, Gallium Arsenide. The MMIC is generally bonded to a package substrate constructed of a ceramic material, e.g., alumina, having thin films of metals, e.g., nickel or titanium, disposed on its surface in the form of an arrangement of wave guides. The waveguides comprise a patterned metalization which includes a plurality of ground planes, signal traces and unmetalized gaps through which the microwave signals are transmitted. The MMIC is connected to the ground planes and signal traces on the surface of the substrate by methods such as wirebonding, solder bumps or flipped chips. Vias, e.g., holes or slots, in the ceramic substrate are filled with a conductive composite material such as copper-tungsten, which provides a transmission path for the signal from the metalization on the surface through the substrate itself. The composite material within the vias is in turn connected to input/output (I/O) ports of the MMIC package, which transmit the microwave signals therethrough. Existing packages are surface mounted to a mother PC board and are connected to the circuitry of the PC board through the I/O ports, which can include conductive balls (spheres), bumps (rounded protrusions), ribbons or leads.

The MMIC of the MMIC package is connected to the mother PC board in a way that is electrically transparent to microwave signals transmitted therebetween. Achieving electrical transparency requires matching the impedance of the microwave transmission path through all transition areas for the signal, i.e., areas between waveguides, from the mother board to the MMIC. Prior art transition areas for the signal include: 1) from the mother board through the I/O connection between the mother board and the package substrate, 2) through the substrate itself, and 3) from the surface where the MMIC is installed through the connection (e.g. wirebond, flip chip) to the MMIC.

Referring to FIG. 1, a prior art MMIC package 10 is illustrated where a mother PC board 12 has a waveguide 14 bonded to its top surface, and a substrate 16 has waveguides 18 and 20 bonded to its underside and topside respectively. The waveguide 14 includes signal conductor 30 and ground conductors 32 and 34; waveguide 18 includes signal conductor 36 and ground conductors 38 and 40; and waveguide 20 includes signal conductor 42 and ground conductors 44 and 46. Transition area 1, i.e., I/O ports of package 10, comprises thin and wide conductive stubs 22, transition area 2, i.e., through substrate 16, comprises narrow and wide slots (vias) 24 in the package substrate filled with an electrically conductive material, and transition area 3 comprises wire bonds 26 connected to the MMIC 28. FIG. 1 illustrates where the dielectric constants of the substrate 16 and the mother board 12 are the same and the two transitions 1 and 2 of the waveguide structures are very close to the ideal. One of the factors in the representation of FIG. 1 that makes the transitions close to ideal are the conductively filled vias 24 and stubs 22 that match the width of the conductors with which they make contact (30, 32, 34 on the mother board; 36, 38, 40 on the underside of the package; and 42, 44 and 46 on the top surface of the substrate 16). The lack of variation in dielectric constant in this Figure enables the use of straight coplanar waveguide structures.

In order to provide the transmission path through the substrate 16 itself, the transition area 2, the vias 24 are preferably drilled in the ceramic substrate with a carbon dioxide or YAG laser. The slots are then filled with the conductive composite material in a powder form, whereby the powder is melted in ovens and then cooled to provide conductively filled through structures, i.e., vias, for the microwave signals. However the ceramic substrate is brittle and can often be cracked by the thermal expansion and contraction of the composite material. This is especially problematic when there are a large number of vias for a complex circuit or the substrate is relatively thin.

Problematically, package substrate thickness is defined by a tradeoff between performance, mechanical strength and cost. The thicker the substrate the greater the mechanical strength and the less breakage that occurs during the manufacturing process. Yet it is generally required to minimize via length, by reducing the thickness of the substrate, in order to enhance high frequency performance and to facilitate impedance matching of the transition area. However, the brittle ceramic substrate can contain a high density of vias, which makes the substrate very fragile, difficult to handle and expensive. Therefore, the chances of losses due to thin substrate breakage are increased when the substrate is made thinner. Thus, the requirement for a thinner substrate may result in losses due to substrate breakage.

The deficiencies and limitations of the above package are eliminated or greatly alleviated by the present invention.

SUMMARY OF THE INVENTION

This invention offers advantages and alternatives over the prior art by providing a circuit package for a microwave signal having a reduced number of vias in the substrate. The substrate of the package is devoid of signal carrying vias. Advantageously, the invention eliminates a transition area for the signal through the substrate of the package. Moreover, because signal carrying vias are avoided the substrate can be made substantially thick so that manufacturing yield losses due to substrate breakage can be virtually eliminated. Additionally, high frequency performance is enhanced and impedance matching is facilitated.

These and other advantages are accomplished in an exemplary embodiment of the invention by providing a circuit package for a microwave signal. The circuit package comprises a substrate defining a MMIC surface of the substrate and an opposing non-MMIC surface of the substrate. The substrate is devoid of signal carrying vias. An arrangement of waveguides are disposed on the MMIC surface of the substrate. A MMIC is disposed on the MMIC surface of the substrate, and the MMIC is in electrical communication with the waveguide(s). An I/O port is in electrical communication with the waveguide wherein a transmission path for the signal is provided from the I/O port, through the waveguide and to the MMIC.

In a preferred embodiment of the invention, the MMIC surface of the substrate faces the PC board when the I/O port is electrically connected to the PC board.

In another exemplary embodiment, the circuit package includes at least one ground carrying via providing a conductive connection between a pair of ground planes for the signal. The pair of ground planes are disposed on the MMIC surface and the opposing non-MMIC surface of the substrate.

In yet another preferred embodiment of the invention, signal vias continue to be avoided but thermal vias are provided extending from the MMIC surface of the substrate to the non-MMIC surface of the substrate. The thermal vias are arranged to be in thermally conductive contact with the MMIC on one end and a heat sink attached to the non-MMIC surface of the substrate on the opposite end. Since the MMIC surface of the substrate faces the PC board the heat sink is located in a more unrestricted environment for air passage and easily dissipates heat to the environment.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures.

DETAILED DESCRIPTION OF THE PREFERRED EMBODIMENTS

The present invention is directed toward connecting a MMIC to a mother PC board in a way that eliminates signal carrying vias through the substrate of the MMIC package.

MMIC packages of the invention are connected to PC boards in a way that is electrically transparent to microwave signals transmitted therebetween. Achieving electrical transparency requires matching the impedance of the transmission path through all transition areas from the mother board to the MMIC. The transition areas for a MMIC package in accordance with the invention are: 1) from the mother board through the input/output (I/O) connection between the mother board and the package substrate, and 2) from the surface where the MMIC is installed through the connection, e.g., wirebond, to the MMIC.

Figure 1:
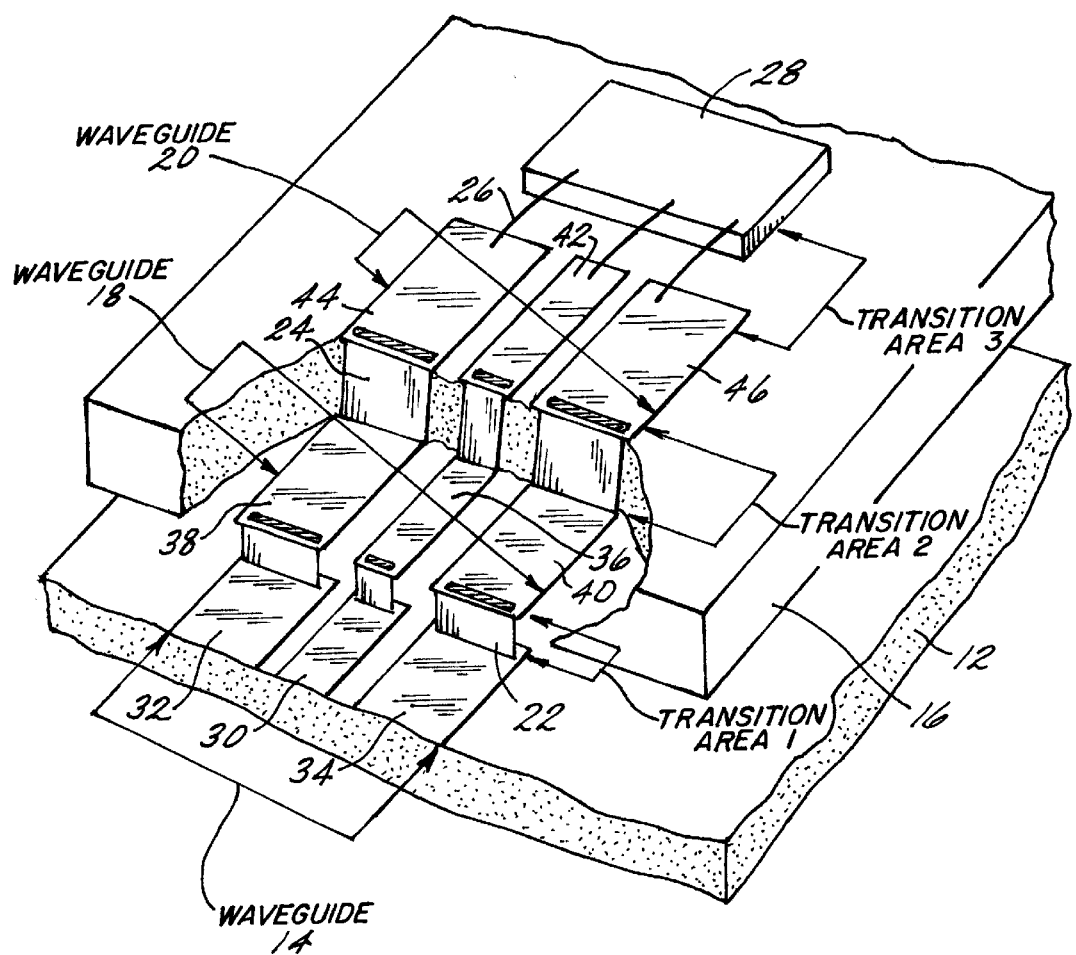
FIG. 1 is a schematic perspective view of a prior art MMIC package.
Figure 2:
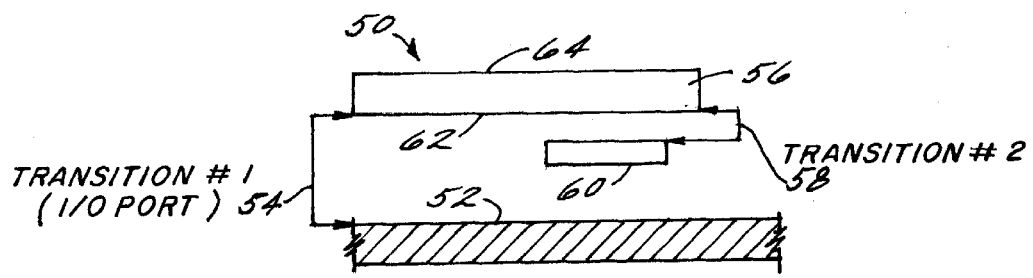
FIG. 2 is an exploded schematic view of a MMIC package in accordance with the present invention.

Referring to FIG. 2, the transition areas of an exemplary MMIC package 50 in accordance with the present invention are illustrated schematically. Therein 52 indicates the mother PC board, 54 indicates the first transition area, 56 indicates the package substrate, 58 indicates the second transition area and 60 indicates the MMIC. It is important to note that the transition area through the substrate 56 itself is eliminated. This is because the position of the substrate 56 and MMIC 60 relative to the mother board 52 have been reversed, eliminating the requirement for signal carrying vias to provide a transmission path for the signal through the substrate 56. That is, the surface on which the MMIC is bonded (the MMIC surface) 62 faces the PC board 52, and the opposing non-MMIC surface 64 faces away from the PC board 52.

Figure 3:
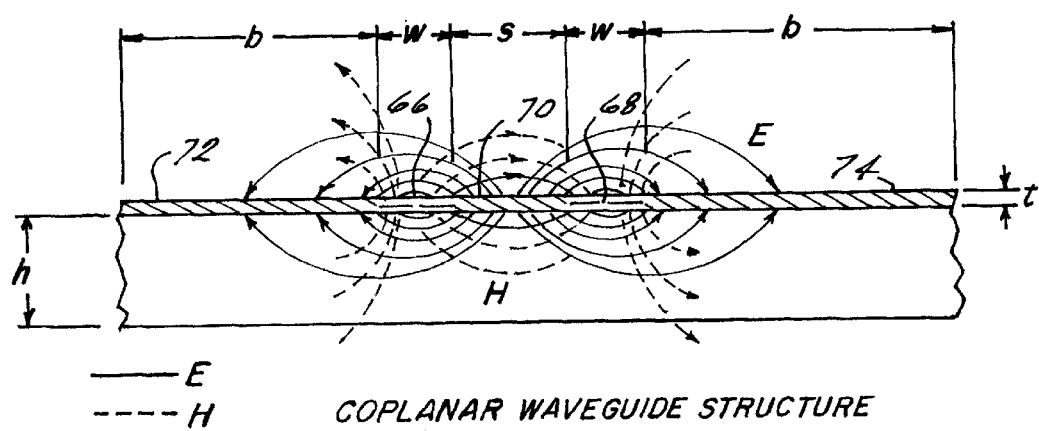
FIG. 3 is an end view of a coplanar waveguide structure in accordance with the invention illustrating field lines.
Figure 4:
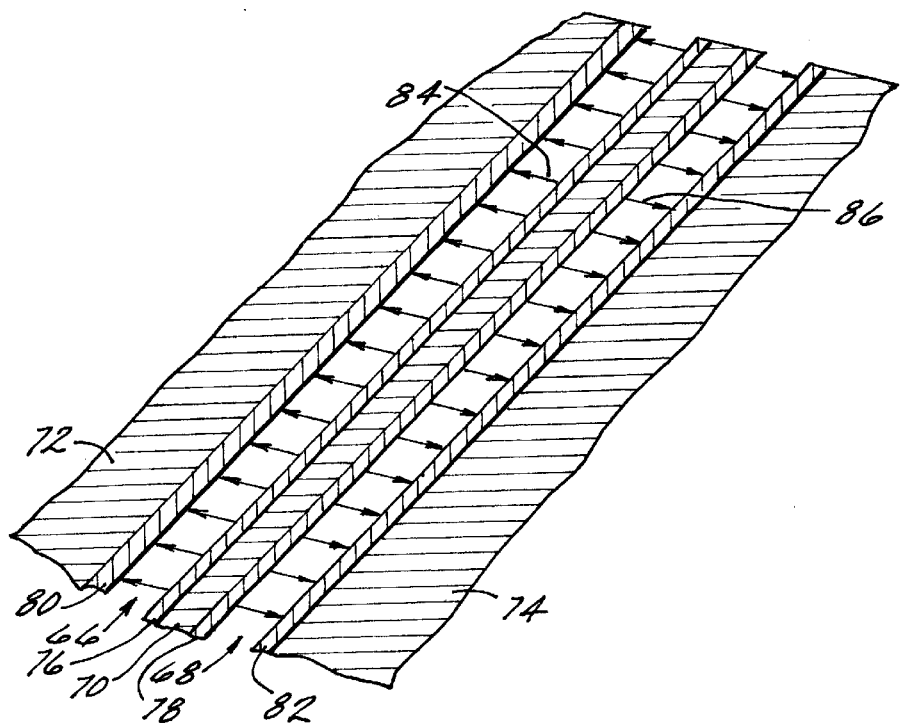
FIG. 4 is a perspective view of the structure of FIG. 3.

Referring to FIGS. 3 and 4, a flat coplanar waveguide is illustrated as it transmits microwave energy to the MMIC 60 (not shown). Waveguides are used to provide conductive transmission paths for microwaves from the mother board to the MMIC and back.

As best shown in FIG. 3, the electric field E and magnetic field H of the microwave energy are concentrated between the spaces 66 and 68. Spaces 66 and 68 have a width (w) and a thickness (t). Changes in the width (w) and thickness (t) of spaces 66 and 68 affects the frequency of the microwave energy that can be transmitted and the value of the impedance to which the energy is subjected.

As best seen in FIG. 4, the center trace 70 is the signal conductor while the metalization 72, 74 on either side thereof is the ground plane. The width of center trace 70 is adjusted according to a dielectric constant of the substrate and at least one transition area that provides for communication between the various componentry of the MMIC package. The signal conductor 70 is spaced (width w) from the ground plane conductors 72 and 74 to control the inductance and capacitance of the circuit. Controlling those parameters by controlling the spacing (w) between the conductors is one of the factors to consider for controlling the impedance of the circuit in order to provide matched impedance pathways from the MMIC to the mother PC board and back.

RF currents in the respective conductors (signal and ground) flow in narrow regions adjacent the spacings 66, 68. The regions are identified by the numerals 76, 78 for the signal conductor 70 and by 80 and 82 for the respective ground plane conductors 72 and 74. Within spacings 66, 68 a spatial electric field configuration is shown by arrows 84 and 86. Spacings 66, 68 are essentially gaps in the metalization which expose the dielectric material, e.g., the surface of a mother board or the surface of a substrate. This causes capacitance and inductance and modifies the electric field created between the conductors 70, 72 and 70, 74 as it passes therethrough.

Figure 5:
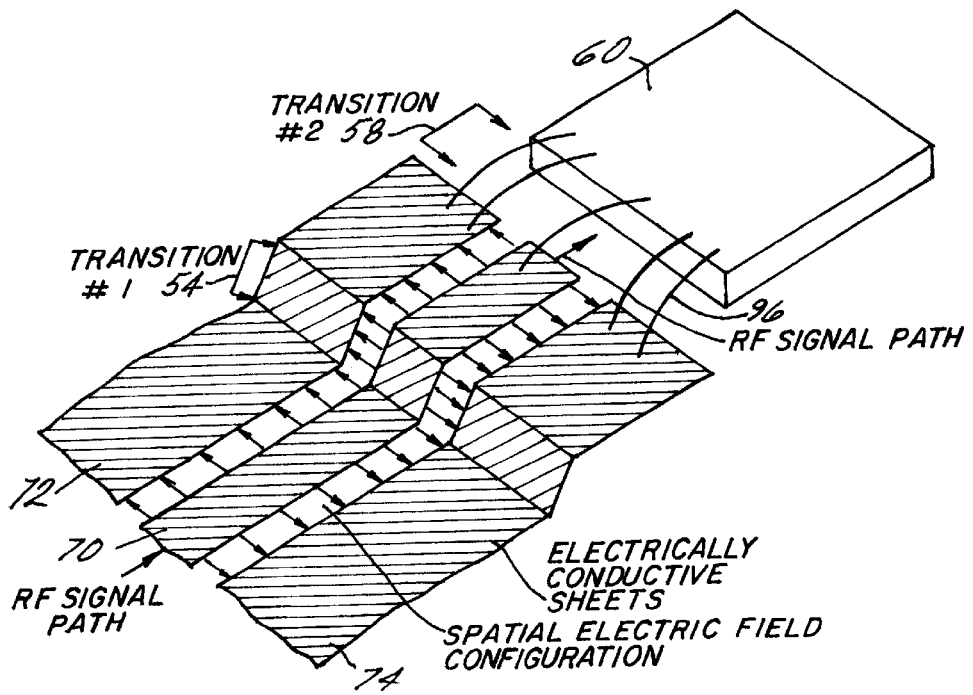
FIG. 5 is a schematic perspective view of the concept of the invention.

Referring to FIG. 5, an exemplary embodiment of the present invention is illustrated wherein the concept of the flat coplanar waveguide is applied to a multilevel construction. Multilevel constructions are typical for MMIC packages because of the need for PC board 52, substrate 56, and the MMIC 60. In industry, these components are built by different manufacturers or units. The MMIC, therefore, is not simply connected directly to the mother PC board. There are a number of transitions and different materials properties to contend with. These in addition to cross sectional dimensions become critical and complex in order to maintain impedance matching.

FIG. 5 broadly and schematically illustrates the exemplary embodiment of the present invention without any change in dielectric constant among the materials. Notice that this is a minimal two transition configuration. This is due to the elimination of vias through the substrate itself since the requirement to provide a transmission path through the substrate is eliminated. Transition path 1 is shown as an idealized, zero thickness layer of electrically conductive materials. This is particularly difficult to realize in practice, since transition 1 is between the mother PC board and the package. The conductor structure of transition is intended to bridge the gap (occupied by air) between the mother PC board and the package substrate and, therefore, requires considerable strength.

Figure 6:
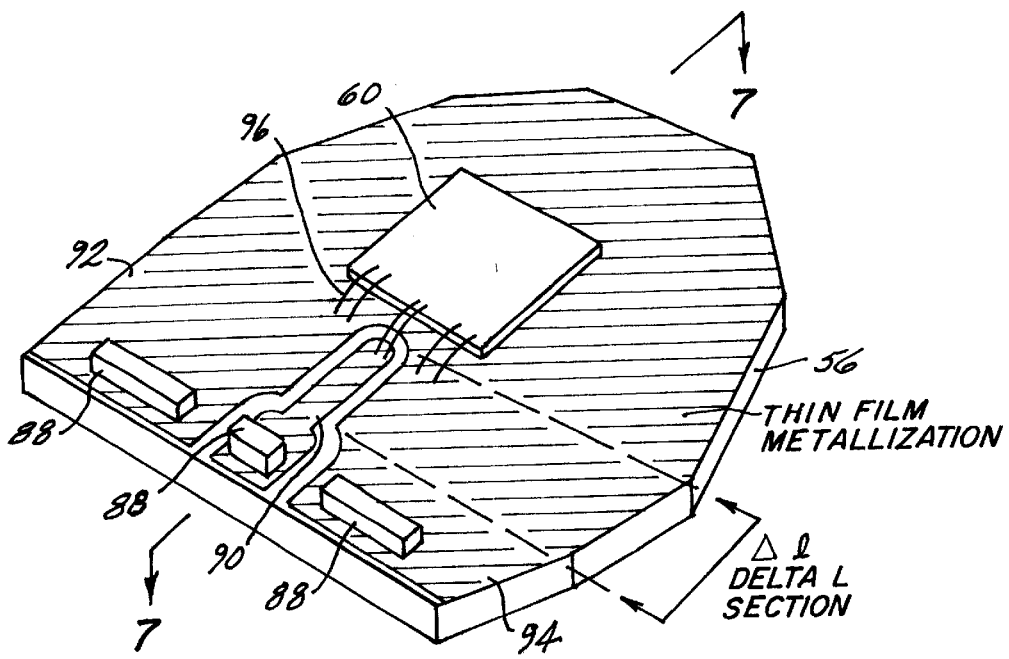
FIG. 6 is perspective view of an exemplary embodiment of the invention showing conductive stubs in the I/O ports.
Figure 7:
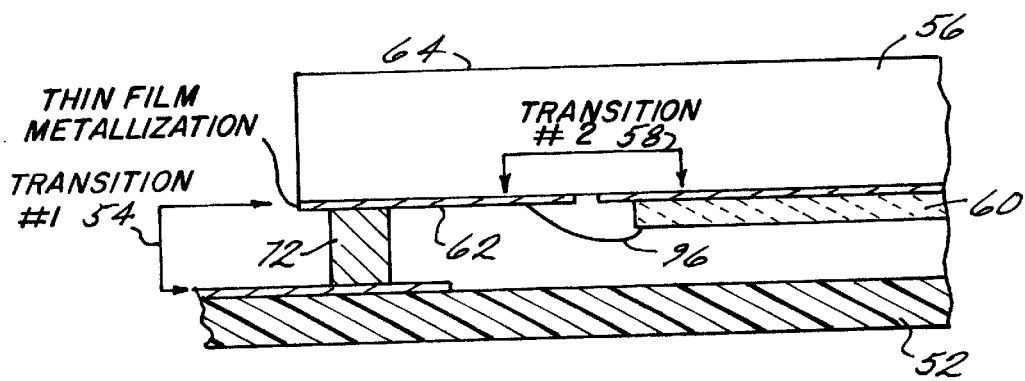
FIG. 7 is a cross section view of FIG. 6 taken along section line 7—7.

Referring to FIGS. 6 and 7, an exemplary embodiment of a MMIC package of the present invention is illustrated, where the dielectric constants of the of the substrate 56 and the mother board 52 are the same and transition 1, i.e., the I/O ports, is very close to the ideal. It is important to note that one of the factors that makes transition 1 ideal are that the stubs 88 nearly match the width of the conductors with which they make contact (30, 32, 34 on the mother board and 90, 92, 94 on the substrate). Transition 2, reference numeral 58, is from the surface where the MMIC is installed (MMIC surface) 62 through the wire bonds 96 to the MMIC 60 itself.

Advantageously, by reversing the position of the substrate 56 and the MMIC 60 relative to the mother board 52 the requirement for vias to provide a transmission path through substrate 56 is eliminated. That is the MMIC surface 62 is oriented to face the PC board 52 and the non-MMIC surface 64 faces away. Therefore, a minimal number of two transition areas are required to complete the transmission path for the signal from the mother board 52 to the MMIC 60. Moreover, it is an advantage of the package of the present invention over prior art packages which include signal carrying vias for a transmission path through the substrate itself, that the substrate thickness is not dictated by electrical performance design constraints. The substrate can be made substantially thick so that manufacturing yield losses due to substrate breakage can be virtually eliminated. Additionally, high frequency performance is enhanced and impedance matching is facilitated. Also, the potential introduction of contaminants and structural discontinuities within the substrate itself are virtually eliminated.

Figure 8:
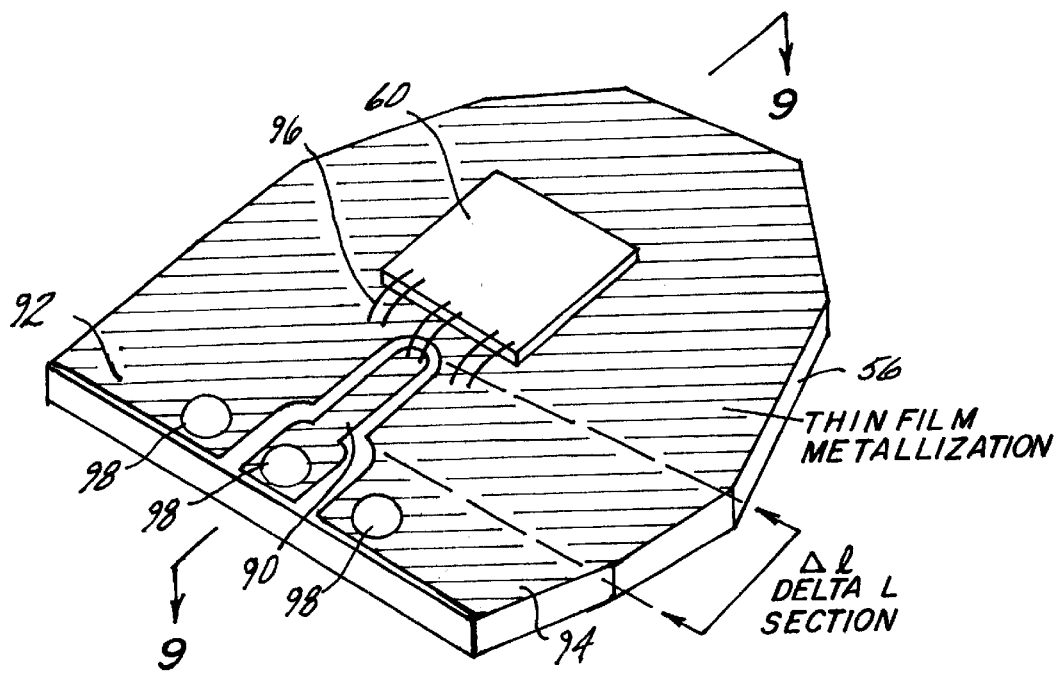
FIG. 8 is a perspective view of an exemplary embodiment of the invention showing conductive balls in the I/O ports.
Figure 9:
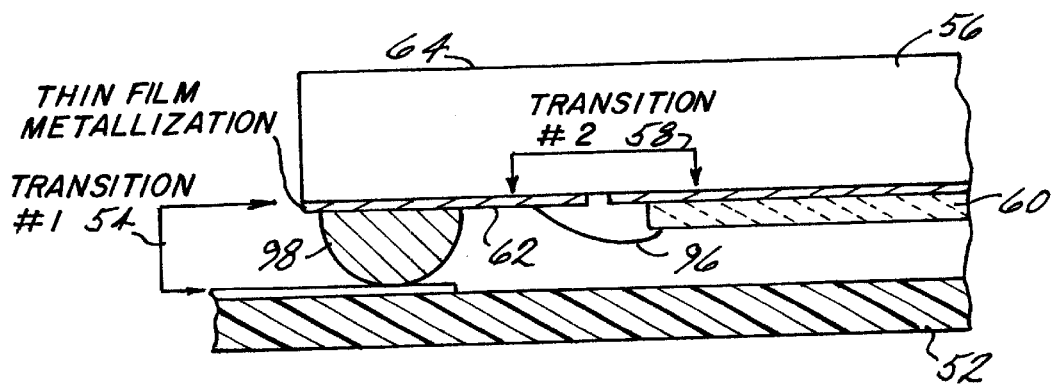
FIG. 9 is a cross section view of FIG. 8 taken along section line 9—9.

Referring to FIGS. 8 and 9, an alternate exemplary embodiment of the present invention shows stubs 88 substituted for by balls (or bumps) 98. The balls 98 are a departure from the more ideal structure of FIG. 6. They introduce a slight discontinuity in the electric (and magnetic) field spacial configuration, i.e., a slight impedance mismatch. The discontinuity is compensated for by extending the center conductor 90 as it emerges from the signal ball 98 by a small length of preferably less than ¼ of the wavelength of the highest frequency to be transmitted. This feature is labeled Δ1 in FIG. 8. Note that this embodiment only contains two transition areas as signal transmission through the substrate 56 is not required.

Figure 10:
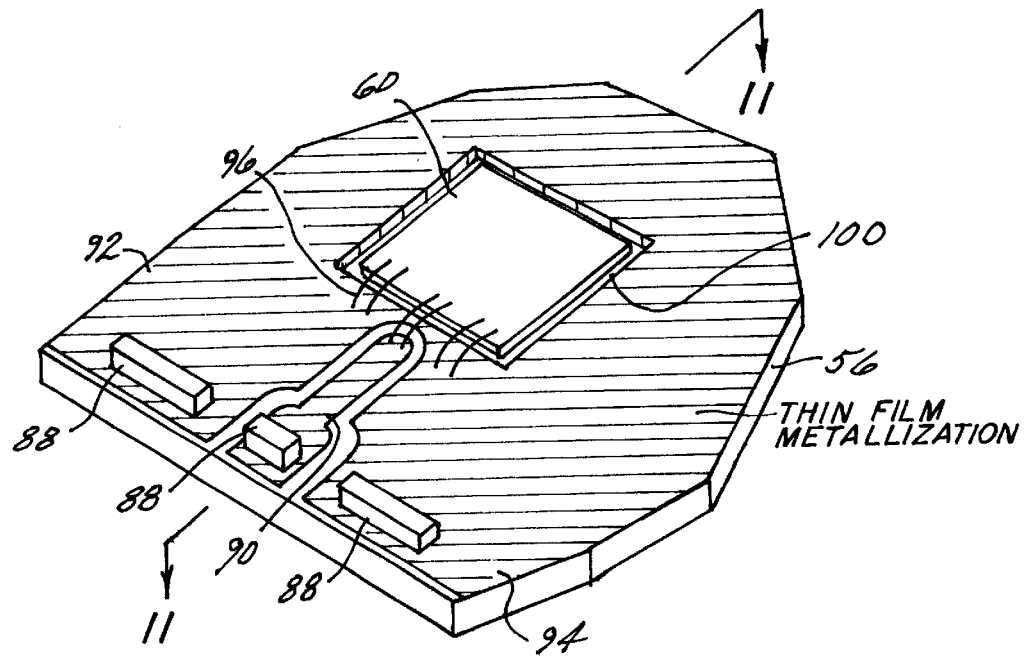
FIG. 10 is a perspective view of an exemplary embodiment of the invention showing a recess in the substrate.
Figure 11:
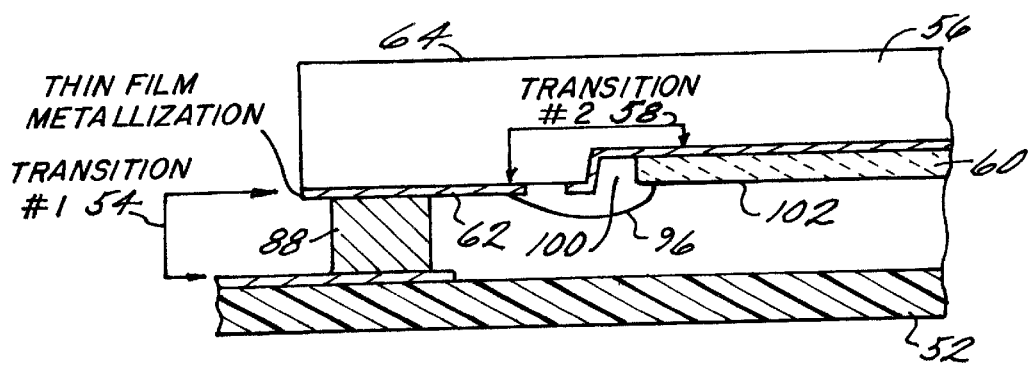
FIG. 11 is a cross section view of FIG. 10 taken along section line 11—11.

Referring to FIGS. 10 and 11, another exemplary embodiment of the present invention is illustrated. In this case, the MMIC 60 is installed in a recess or cavity 100 as deep as the MMIC thickness plus the thickness of the die attached material, e.g., silver epoxy, used to bond the MMIC 60 to the substrate 56. This substantially aligns the top substrate surface 102 with the MMIC surface 62. Thus, the wire bonds 96 that connect the MMIC surface 62 with the substrate 56 are substantially shorter than those of the embodiments without the recess, thus reducing their inductance.

The substrate 56 is made of a fully sintered high aluminum material, i.e., greater than 96%. The recess in the substrate is typically of a depth of 0.004" to 0.006" (MMIC thickness plus the thickness of the die attached material). The coplanar waveguide structures are created by metallizing the substrate by means of vapor deposited or sputtered thick films of metals, such as Titanium and Nickel or suitable combinations of metals, such that there will be good adhesion to the substrate and good electrical conductivity. The circuitry patterns are created by a well known photoresist-etch process or by physically masking metal vapor deposition. The circuitry patterns are preferably coated with a thin layer of gold to provide high electrical conductivity for the microwave signals, which is conducive to low power losses. The structure can also be created by screen printing and firing thick film conductive pastes or inks. Alternatively, the substrate 14 can be a premolded piece of a low loss tangent (less than 0.0004) plastic material, such as a polytetrafluoroethylene (PTFE) composite or epoxy.

Figure 12:
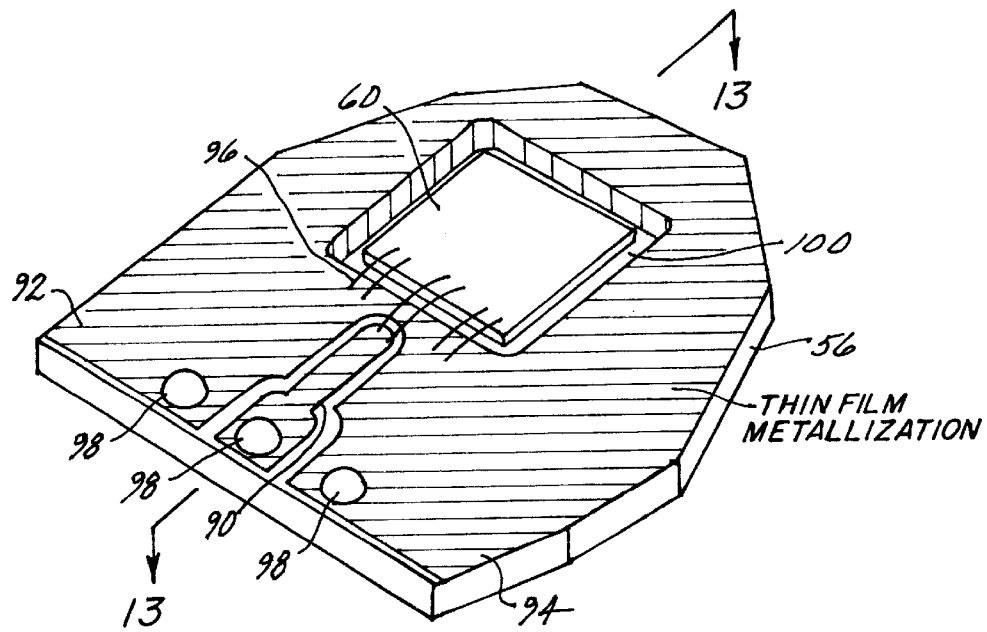
FIG. 12 is a perspective view of an exemplary embodiment of the invention showing a recess in the substrate and conductive balls in the I/O ports.
Figure 13:
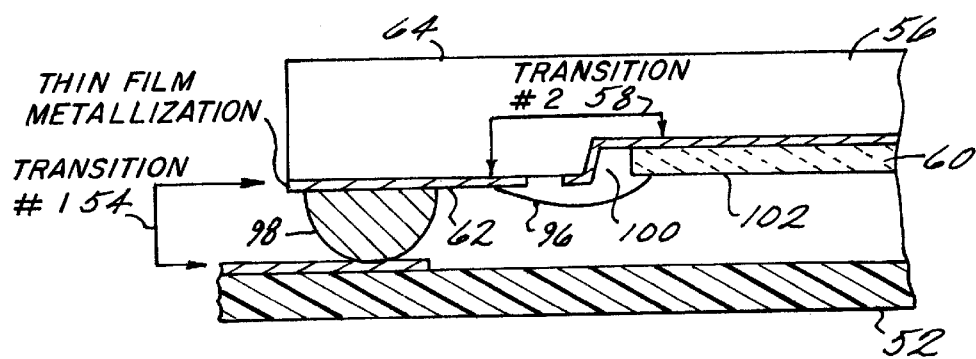
FIG. 13 is a cross section view of FIG. 12 taken along section line 13—13.

Referring to FIGS. 12 and 13, another exemplary embodiment of the present invention shows the transition of the coplanar waveguide from the substrate 56 to the mother board 52 as being made by conductive balls (or bumps) 98 attached to the mother board 52 by solder or a suitable electrically conductive material. The balls 98 themselves are attached to the waveguide structure of the substrate 56 by means of soldering or brazing using a material that has a melting point higher than that of the solder used to connect the balls 98 to the mother board 52. The mother board 52 itself is made of alumina, Teflon composites, or other insulating material with a lost tangent in the vicinity of 0.0004 within the frequency range of the MMIC package.

Figure 14:
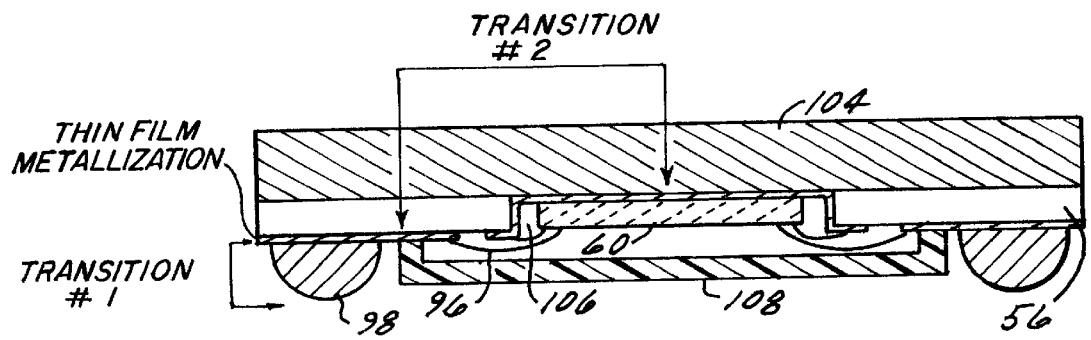
FIG. 14 is a perspective view of an exemplary embodiment of the invention showing a heat sink mounted to the substrate.
Figure 15:
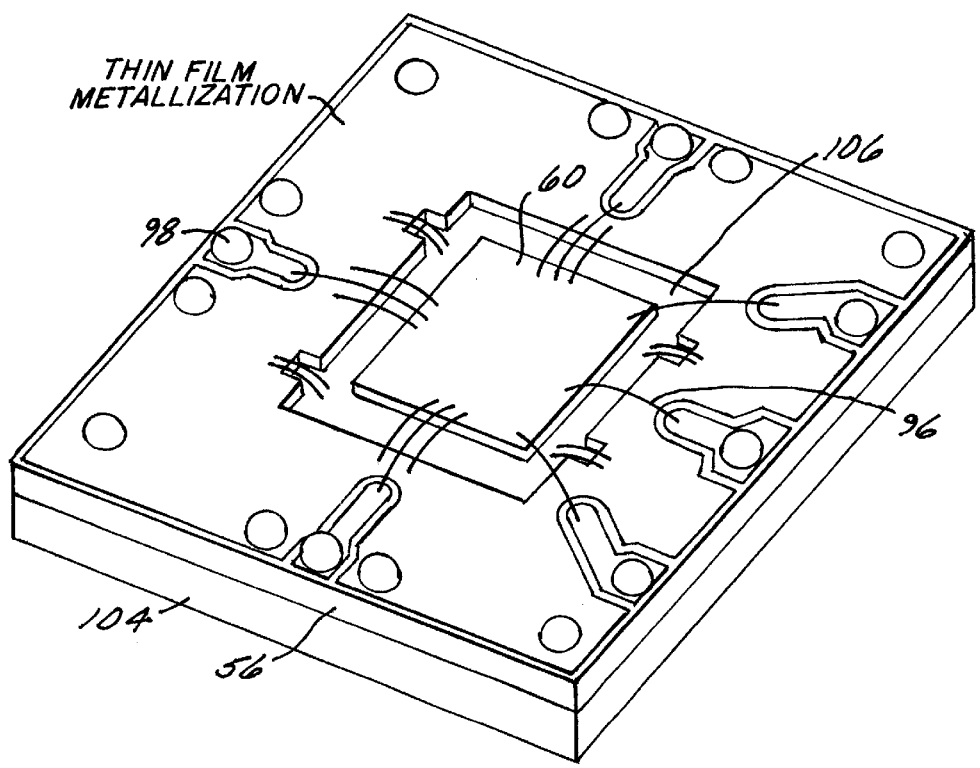
FIG. 15 is a cross section view of FIG. 14 taken along section line 15—15.

Referring to FIGS. 14 and 15, another exemplary embodiment of the present invention is illustrated. The MMIC package body is built by bonding a piece of high thermal conductivity material 104 that functions as a heat sink, to a ceramic substrate 56, which has an opening 106 generally at the center. The MMIC 60 is attached to the heat sink 104 within the ceramic substrate opening 106. The heat sink-ceramic substrate assembly is metalized and patterned by thin film photo resist etch methods or by thick film screen printing of electrically conductive inks. Electrically conductive bumps 98 are attached to the metalized ceramic substrate for package attachment to a mother board (not shown). The entire circuitry of the package, including the bumps 98, is coated with gold for high electrical conductivity, wire bondability and protection against the environment.

The opening in the ceramic substrate 106 can be produced by laser cutting, using a carbon dioxide or YAG laser, or by punching the ceramic in the green state, firing and lapping the substrate to achieve the required flatness.

The heat sink 106 is made of a material with high thermal conductivity and a coefficient of thermal expansion equal to or slightly larger than the MMIC (5.7 ppm/deg K for Gallium Arsenide) such as Tungsten-Copper, Copper-Molybdenum-Copper, or other adequate material. The heat sink is bonded to the ceramic substrate by direct copper bonding, anodic bonding, brazing, or other adequate methods.

A lid 108, made of ceramic or plastic, is attached to the area indicated to protect the MMIC from the environment after attachment and wirebonding.

When properly designed according to the invention the package is capable of dissipating heat generated by typical power MMIC's from 1.0 to about 5.0 watts. The heat sink is connected to the package ground by means of wirebonds through cutouts in the ceramic substrate as shown.

Figure 16:
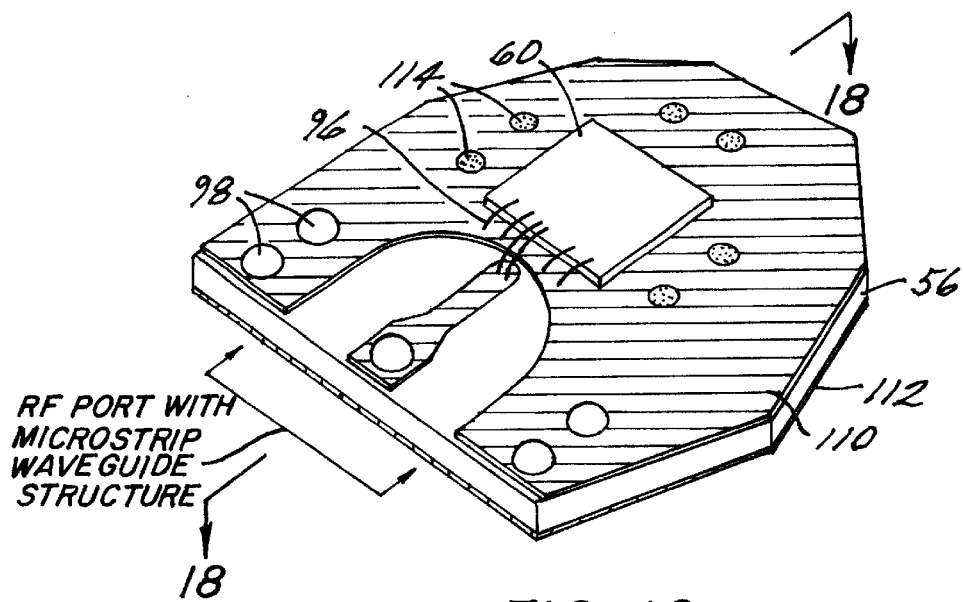
FIG. 16 is a perspective view of an exemplary embodiment of the invention showing a microstrip waveguide structure having vias conductively connecting the ground planes.
Figure 17:
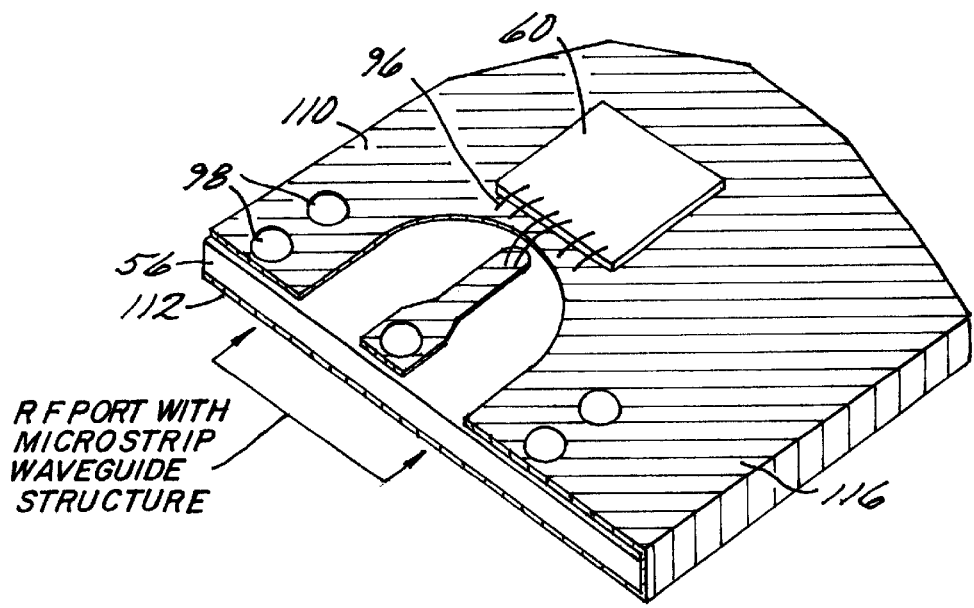
FIG. 17 is a perspective view of an exemplary embodiment of the invention showing a microstrip waveguide structure having a thin film metalization wraparound conductively connecting the ground planes.

Referring to FIGS. 16 and 17, an exemplary embodiment of the present invention utilizing a microstrip configuration is shown. The microstrip configuration contains a ground plane 110 on the surface of the substrate 56 where the MMIC is installed, i.e., the MMIC surface 62, and a ground plane 112 on the opposing non-MMIC surface 64 of the substrate 56. The two ground planes 110 and 112 are connected by means of ground carrying vias 114 filled with a metallic conductive material as shown in FIG. 16 or by means of a metalization wraparound 116 as shown in FIG. 17.

Figure 18:
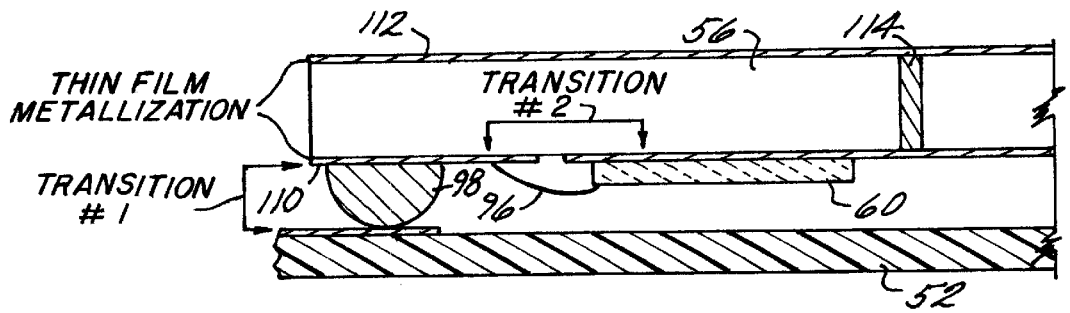
FIG. 18 is a cross section view of FIG. 16 taken along section line 18—18.
Figure 19:
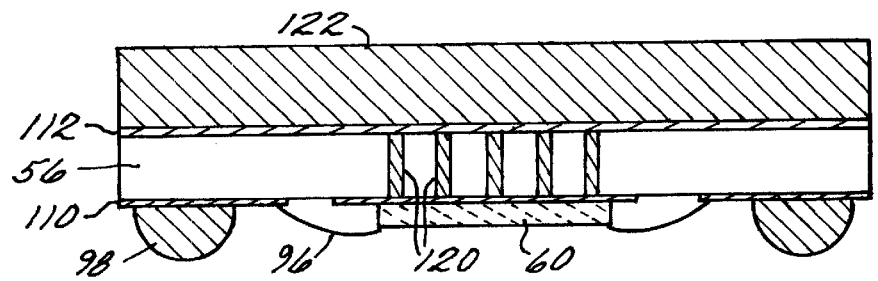
FIG. 19 is a cross section view of another embodiment of the invention illustrating thermal vias and a heat sink attached to the substrate.

Referring to FIG. 18, the microstrip configuration of FIG. 16 is shown connected to the mother board 52. It is important to note that no other vias other than the ground carrying vias 114 are required to connect the two ground planes 110 and 112 through substrate 56. Therefore all signal carrying vias are eliminated, and only two signal transition areas from the mother board 52 to the substrate 56, i.e., the I/O ports, and from the substrate 56 to the MMIC 60 are required for this configuration.

In another preferred embodiment of the invention, the MMIC package is further enhanced by the provision of thermal vias 120 connecting to two ground planes 110 and 112 so that heat generated by MMIC 60 is drawn away therefrom by thermal vias 120. Preferably a heat sink 122 is heat conductively attached (brazing, soldering, etc.) to ground plane 112 directly in line with thermal vias 120 such that heat conducted away from MMIC 60 along thermal vias 120 is conducted into and spread within heat sink 122. Heat is dissipated from heat sink 122 into the surrounding environment. By removing heat from the MMIC, higher performance is achieved.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A circuit package for a microwave signal, the package comprising:
   a substrate defining a MMIC surface of the substrate and an opposing non-MMIC surface of the substrate, the substrate devoid of signal carrying vias, and the MMIC surface of the substrate being configured to be parallel to a surface of a mother PC board spacedly positioned adjacent the MMIC surface of the substrate;
   a non-shorted waveguide disposed on the MMIC surface of the substrate;
   a MMIC disposed on the MMIC surface of the substrate, the MMIC being in electrical communication with the non-shorted waveguide; and
   an I/O port in electrical communication with the non-shorted waveguide wherein a transmission path for the microwave signal is provided from the mother PC board through the I/O port through the waveguide and to the MMIC.

2. The circuit package of claim 1 wherein the I/O port is electrically connectable to a PC board, the MMIC surface of the substrate facing the PC board when the I/O port is electrically connected to the PC board.

3. The circuit package of claim 1 further including at least one ground carrying via providing a conductive connection between a pair of ground planes for the signal, the pair of ground planes disposed on the MMIC surface and the opposing non-MMIC surface of the substrate.

4. The circuit package of claim 1 wherein the package comprises a microstripline structure.

5. The circuit package of claim 1 wherein the waveguide comprises a non-shorted waveguide.

6. The circuit package of claim 1 wherein the substrate further includes a heat sink disposed on the non-MMIC surface of the substrate.

7. The circuit package of claim 1 wherein the substrate is fabricated from an alumina material or a low-loss tangent plastic material.

8. The circuit package of claim 1 wherein the I/O port comprises at least one of a conductive stub, a conductive ball and a conductive bump.

9. The circuit package of claim 8 wherein the at least one of a conductive stub, ball and bump comprises at least one of a plurality of conductive stubs, balls and bumps.

10. The circuit package of claim 1 wherein said package further comprises at least one thermal via extending through said substrate and located in thermal conductivity to said MMIC.

11. The circuit package of claim 10 wherein said package further comprises a heat sink thermally coupled to said at least one thermal via.

12. A circuit package for a microwave signal, the package comprising:
   a substrate defining a MMIC surface of the substrate and an opposing non-MMIC surface of the substrate, the MMIC surface of the substrate being configured to be parallel to a surface of a mother PC board spacedly positioned adjacent the MMIC surface of the substrate;

a non-shorted waveguide disposed on the MMIC surface of the substrate;

a MMIC disposed on the MMIC surface of the substrate, the MMIC in electrical communication with the waveguide; and an I/O port being electrically connectable to the PC board, the MMIC surface of the substrate facing the PC board when the I/O port is electrically connected to the PC board, the I/O port in electrical communication with the waveguide wherein a transmission path for the signal is provided from the I/O port, through the waveguide and to the MMIC.

13. The circuit package of claim 12 wherein the package comprises a microstripline structure.

14. The circuit package of claim 12 wherein the waveguide comprises a coplanar waveguide.

15. The circuit package of claim 12 wherein the waveguide comprises a patterned metalization, the metalization including a ground plane and signal traces wherein a length of each signal trace, an unmetalized gap between the signal traces and the ground plane, and the width of each signal trace is adjusted according to a dielectric constant of the substrate and at least one transition area.

16. The circuit package of claim 12 wherein the I/O port comprises at least one conductive stub or at least one conductive ball.

17. The circuit package of claim 12 wherein the substrate further includes a recess for the MMIC, the recess being of a depth to substantially align the MMIC surface of the substrate with a top surface of the MMIC when the MMIC is disposed therein.

18. The circuit package of claim 12 wherein the substrate further includes a heat sink disposed on the non-MMIC surface of the substrate.

* * * * *

UNITED STATES PATENT AND TRADEMARK OFFICE
CERTIFICATE OF CORRECTION

PATENT NO. : 6,426,686 B1  
APPLICATION NO. : 09/334195  
DATED : July 30, 2002  
INVENTOR(S) : Daniel F. Douriet et al.

It is certified that error appears in the above-identified patent and that said Letters Patent is hereby corrected as shown below:

Column 5, line 46, after "transition" insert --1--.

Signed and Sealed this

Twenty-fifth Day of December, 2007

JON W. DUDAS  
*Director of the United States Patent and Trademark Office*